(12) United States Patent
Pool et al.

(10) Patent No.: US 6,198,272 B1
(45) Date of Patent: Mar. 6, 2001

(54) PLUG CONSTRUCTION HAVING POSITIVE AND NEGATIVE POLES FOR CIRCUIT TESTING ON VEHICLES

(75) Inventors: James L. Pool, Clarinda, IA (US); Billy G. Stallings, Jr., Kinston, NC (US)

(73) Assignee: Lisle Corporation, Clarinda, IA (US)

( * ) Notice: Subject to any disclaimer, the term of this patent is extended or adjusted under 35 U.S.C. 154(b) by 0 days.

(21) Appl. No.: 09/087,418

(22) Filed: May 29, 1998

Related U.S. Application Data

(63) Continuation-in-part of application No. 08/972,502, filed on Nov. 18, 1997, now abandoned.

(51) Int. Cl.[7] .......................... G01R 19/14; G01R 31/00; B60Q 1/00; F21V 13/02
(52) U.S. Cl. .......................... 324/133; 324/503; 324/508; 340/425.5; 340/438; 362/489
(58) Field of Search .................................. 324/133, 503, 324/508, 511, 538, 555, 556; 340/425.5, 438, 428, 439, 635, 636; 362/488, 489

(56) References Cited

U.S. PATENT DOCUMENTS

| | | | |
|---|---|---|---|
| 4,163,186 | * | 7/1979 | Haley .................................. 340/636 |
| 4,540,940 | * | 9/1985 | Nolan .................................. 324/133 |
| 4,899,263 | * | 2/1990 | Lupoli et al. ........................ 362/489 |
| 5,029,048 | * | 7/1991 | Von Gaisber et al. .............. 362/489 |
| 5,030,811 | * | 7/1991 | Von Gaisber et al. .............. 362/489 |
| 5,633,538 | * | 5/1997 | Nickerson ........................... 362/489 |

OTHER PUBLICATIONS

Disclosure from John to Lisle Corp. dated Apr. 14, 1998 relating to Source for electrical testers, automatic roll pin punch, terminal removing tool.
Disclosure from Dave to Lisle Corp. dated Jun. 13, 1990 relating to Automotive 12V Circuit Tester, U.S. Patent No. 4,540,940.
Disclosure from Jeff to Lisle Corp. dated Feb. 3, 1992 relating to Automotive Electric.
Disclosure from Paul to Lisle Corp. dated Sep. 4, 1992 relating to a tool for testing electrical systems in cars or boats.
Disclosure from Marty to Lisle Corp. dated Nov. 22, 1993 relating to the ever increasing problem of finding a good ground for a test light or volt meter in modern automobiles.
Disclosure from James to Lisle Corp. dated Mar. 15, 1994 relating to Power/Ground Access Plug.
Disclosure from Thomas to Lisle Corp. dated May 22, 1995 relating to finding a good ground on interior of vehicle quickly, possibly using a long coiled wire to reach rear of vehicle.
Disclosure from Billy to Lisle Corp. dated Nov. 28,1995 relating to a tool for a known good 12V hot source and ground source.
Disclosure from Patrick to Lisle Corp. dated Nov. 29, 1995 relating to automotive electrical checking.
Disclosure from Hoon to Lisle Corp. dated Jul. 30, 1996 relating to a multipurpose energizable automotive electrical tester with illumination and audio output that can be connected to a cigarette lighter socket or directly to battery with an optional adaptor.
Disclosure from Robert to Lisle Corp. dated Apr. 29, 1997 relating to a low voltage circuit tester.

* cited by examiner

Primary Examiner—Josie Ballato
Assistant Examiner—Jermele M. Hollington
(74) Attorney, Agent, or Firm—Banner & Witcoff, Ltd.

(57) ABSTRACT

A combination ground and power source circuit tester device includes a cylindrical plug with a cone-shaped end that fits into a vehicle accessory receptacle. An attached body member engages the plug and retains first and second radially extending contacts that function to provide a connection with conductive studs that attach to leads to a circuit. A light bulb indicating that the circuitry is powered is retained in the body member and in a parallel circuit with the contacts.

6 Claims, 3 Drawing Sheets

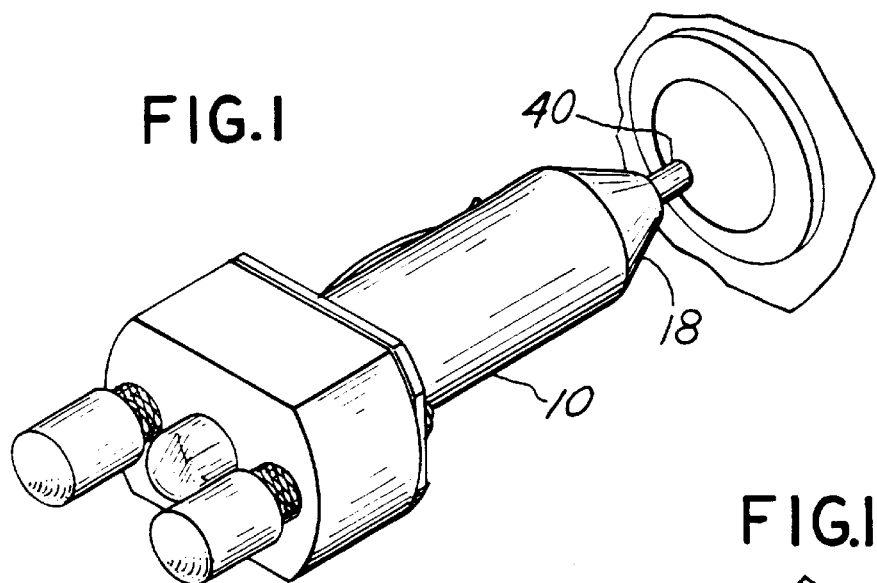
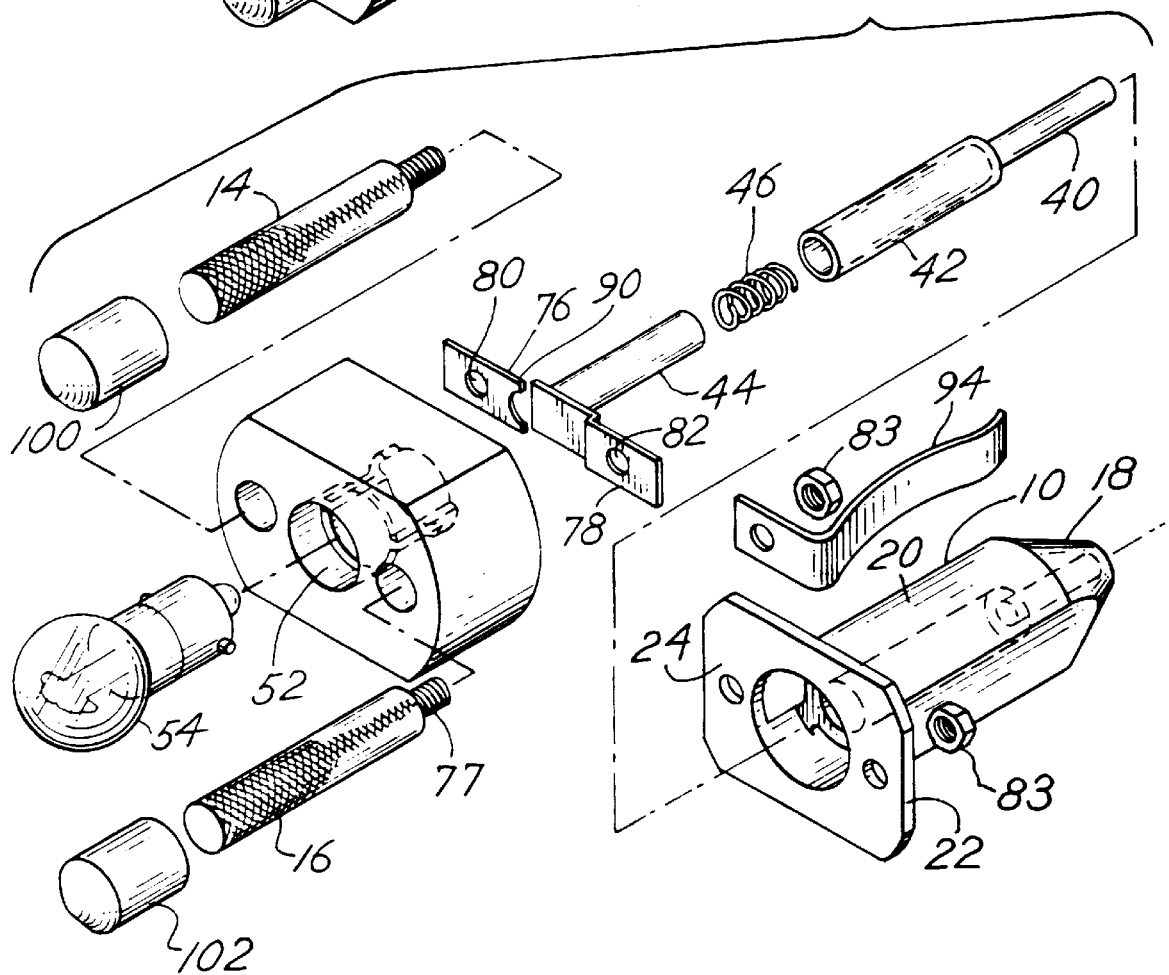

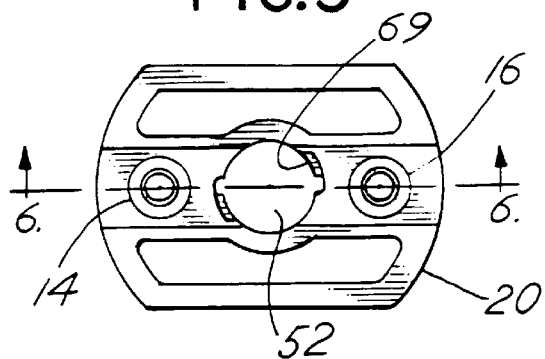
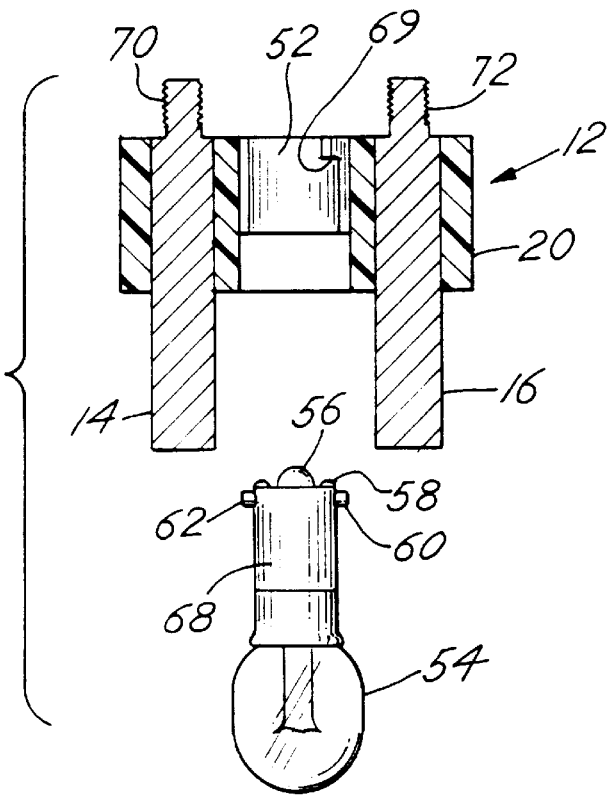
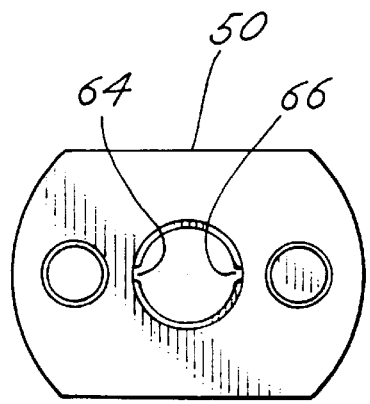

PLUG CONSTRUCTION HAVING POSITIVE AND NEGATIVE POLES FOR CIRCUIT TESTING ON VEHICLES

CROSS REFERENCE TO RELATED APPLICATION

This is a continuation-in-part application of prior application Ser. No. 08/972,502 filed Nov. 18, 1997, now abandoned, for which priority is claimed.

BACKGROUND OF THE INVENTION

In a principal aspect, the present invention relates to a combination ground and power source device for use in a cigarette lighter receptacle of a vehicle. The device provides both a ground connection as well as a 12-volt power connection depending upon the terminals of the device which are connected in a circuit. Further, there is an indicator light which identifies whether the system contacts are powered or activated.

Automotive mechanics often need an effective ground to check electrical circuits in a vehicle. Additionally, a power connection is often required to test a circuit or a device. The cigarette lighter receptacle (now often termed the accessory receptacle) in a vehicle has been used to provide power for various purposes, including mobile phones, radar detectors, radios, and circuit testers. Typically, a special plug is provided to fit into the receptacle with leads that connect to the phone, etc. U.S. Pat. No. 4,540,940 discloses an example of a device capable of deriving power from a receptacle in a vehicle.

The use of a device of this nature to provide a ground, as well as a power source, has also been suggested. Applicants' assignee has, for example, as early as 1988, received suggestions of this general nature. There remains, however, the need for a practical, useful, efficient and rugged device of this type. In view of this background, the present device, having a positive and a negative or ground contact for circuit and device testing, was developed.

SUMMARY OF THE INVENTION

Briefly, the present invention comprises a combination ground and power source device for use in an accessory receptacle of a vehicle. The device includes a cylindrical plug which has a cone-shaped end and an axial passage through the plug. The plug is designed to fit within the accessory receptacle of a motor vehicle. The plug is also designed to cooperate with and receive a separate contact or terminal body at the outer end thereof. The terminal body retains a light bulb preferably by means of a bayonet connection and also cooperatively retains first and second, spaced, conductive studs. One of the studs is connected to a ground contact. That ground stud also connects simultaneously with a radial contact retained between the plug and the terminal body. The radial contact serves as a ground for the light bulb. A second radial contact is also retained between the plug and terminal body and makes electrical contact with the hot or powered stud as well as the light bulb retained within the body. The second radial contact further connects with a central spring-biased conductive plunger which projects axially from the device and connects to a power source. The device may thus be used as a ground source or alternatively as a power source when plugged into the vehicle accessory receptacle. The light bulb retained within the central body of the device is in a parallel electrical circuit with the contact studs and provides an indication that circuits are operable through the ground stud as well as the power stud.

Thus it is an object of the invention to provide an improved combination ground and power source device for use with a receptacle in a vehicle.

It is a further object of the invention to provide a combination ground and power source device which includes first and second conductive studs connected respectively to a ground and a power source wherein the same ground and power sources are also connected in parallel through a light bulb or indicator.

Yet a further object of the invention is to provide a ground and power source device which includes a cylindrical plug capable of being positioned within a vehicle accessory receptacle and which further includes a spring-biased contact or plunger within the plug for connecting to the voltage or positive power source in the accessory receptacle.

Another object of the invention is to provide an improved combination ground and power source device which is easy to manufacture, rugged, highly reliable, and reasonably economical.

These and other objects, advantages and features of the invention will be set forth in the detailed description which follows.

BRIEF DESCRIPTION OF THE DRAWING

In the detailed description which follows, reference will be made to the drawing, comprised of the following figures:

FIG. 1 is an isometric view of the improved combination ground and power source device of the invention;

FIG. 1A is an exploded isometric view of the device;

FIG. 5 is a bottom plan view of the body of the device;

FIG. 6 is a cross-sectional view of the body taken substantially along the line 6—6 of FIG. 5; and FIG. 7 is a plan view of the outside end of the body.

DESCRIPTION OF THE PREFERRED EMBODIMENT

Figure 2:
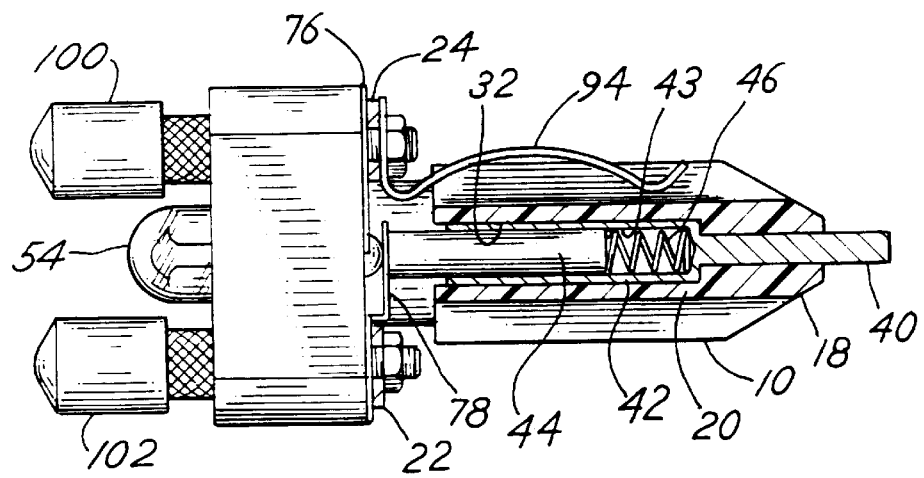
FIG. 2 is a partially cut away elevation view of the device of FIG. 1.
Figure 3:
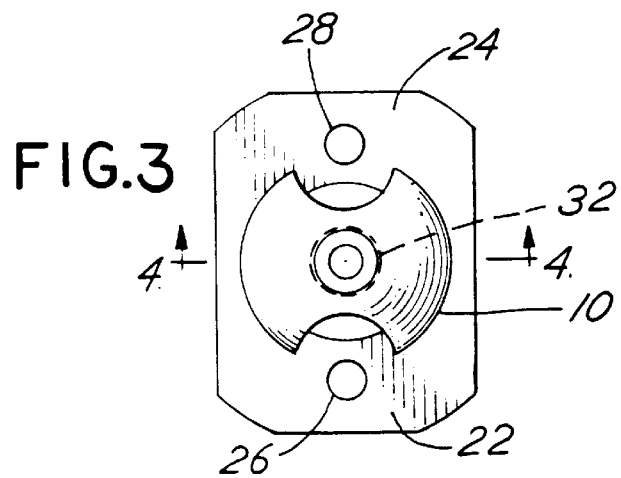
FIG. 3 is an end plan view of the plug of the invention.
Figure 4:
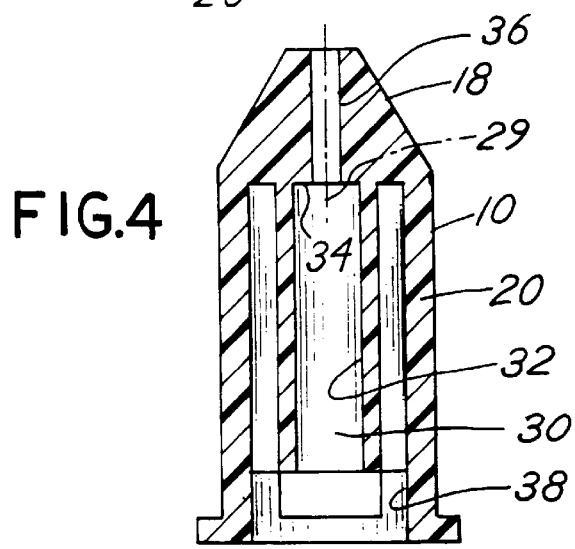
FIG. 4 is a cross-sectional view of the plug taken along the line 4—4 in FIG. 3.

Referring to the figures, the ground and power source device of the present invention is depicted in FIG. 1 and FIG. 1A in isometric views available for insertion into a power and ground receptacle such as a vehicle cigarette lighter receptacle. The device thus includes a cylindrical plug 10 which is made from a non-conductive material, such as the polymeric with the trade name Acetal, by a molding process. The plug 10 cooperates with a separate body and stud assembly 12. A body section 20 of stud assembly 12 is also made from an insulating, or nonconductive, molded material such as the polymeric, Acetal. The body and stud assembly 12 includes generally parallel, outwardly extending, spaced conductive studs 14 and 16 which are described in greater detail below.

The plug 10 is generally cylindrical and includes a forward cone shaped or frustoconical shaped, leading end 18, a cylindrical body section 20 and, at the inside or opposite end, outwardly extending flanges or wings 22 and 24. The plug 10 has a center line axis 29 and the wings 22, 24 extend transversely in opposite directions from the axis 29. A through passage 30 extends axially entirely through the plug 10. The through passage 30 includes a counterbore or counter passage section 32 defining an annular flange 34 connected with a smaller diameter exit passage 36 in the frustoconical shaped, leading end 18. A recessed section or second counterbore 38 is defined in the opposite end of the plug 10 distal from the frustoconical shaped, leading end 18.

As shown in FIG. 2, the plug 10 is adapted to receive a conductive, projecting plunger 40 which extends axially through the passage 36 and includes a connected, increased diameter, hollow cylindrical sliding sleeve or section 42 which rides within the passage 32 and is restricted in its axial movement toward the end 18 by the flange 34. A conductive cylindrical slug or pin 44 fits within the internal diameter of the sleeve 42 and is axially biased by a spring 46. That is, the spring 46 fits within the cylindrical cavity 43 of sleeve 42 and biases against the plunger 40 as well as the pin or slug 44.

The body and stud assembly 12 is comprised of the molded body section 20 and includes the ground stud 14 and the higher voltage, positive or hot stud 16 molded therein as depicted in the figures. The body 20 further includes a through passage 52 which is adapted to receive a light bulb 54 having a base 68 with a center or hot contact 56 and an annular ground contact 58. The base further includes, radial, bayonet projections 60 and 62. The bayonet projections 60 and 62 fit into axial slots 64 and 66 defined respectively in the sides of the through passage 52 of section 20 so that the bulb 54 may be axially inserted into the through passage 52 and more particularly the base 68 may be fitted into the passage 52 and adapted to be rotated so that the lugs or projections 60 and 62 will engage or catch on a flange 69 of section 20. The bulb 54 is biased axially, outwardly in the through passage 52 as will be explained in greater detail below. Passage 52, studs 14, 16 and passage 30 are all parallel to axis 29.

The studs 14 and 16 are made from a conductive material such as copper, brass, or some other conductive material. The studs 14 and 16 have threaded outer ends 70 and 72 with transverse lead passages 71, 73 respectively. The inner ends 75 and 77 are threaded and spaced so as to cooperate with and pass through openings of radial contacts 76 and 78, respectively. Thus a contact 76 includes an opening 80 which receives the end 75 of stud 14 therethrough and which makes electrical contact therewith. The contact 76 extends radially from axis 29 and is positioned to engage with the annular ground contact 58 of the bulb 54. Contact 76 thus includes parallel side extensions 90 at one end and is retained on stud 14 at the opposite end.

The stud 14, and more particularly, threaded end 75, also projects through one of the wings, such as wing 24 of plug 10, and connects with a separate, conductive, low shaped, metal retainer contact 94. The arcuate or flexible bow retainer contact 94 acts as a spring member along one lateral side edge of the plug 20. Thus with respect to the ground connection, the stud 14 connects electrically to the contact 76 as well as to the retainer contact 94. The retainer contact 94, when inserted into an accessory receptacle in an automobile, provides the ground contact. The electrical circuit passes through the stud 14 and also through the contact 76 which connects with the ground side of the bulb 54. The threaded end 75 of stud 14 receives a nut 81, to hold the assembly parts together, including retainer contact 94, wing 22 (plug 10), contact 76, and body section 20. Contacts 94 and 76 sandwich the wing 24.

The other radial, metal contact 78 cooperates with and engages with the stud 16. The stud 16 includes the threaded end 77 which fits through opening 82 in contact 78 and provides for electrical contact therewith. End 77 then fits through opening 85 in wing 22. A hexagonal nut 83 is threaded on end 77 and holds the stud 16 in position engaged with the contact 78 and wing 24. The contact 78 extends generally radially outwardly from the axis 29. It extends from the center axis 29 of the plug 20 and is thus intersected by the axis 29 so that the pin or slug 44 can make electrical contact therewith. The slug 44 is thus biased by spring 46 into engagement with the contact 78. The contact 78 thereby engages the hot side contact 56 of the bulb 54 and serves the dual function of biasing the bulb 54 into position and maintaining it in position in combination with the bayonet connection thereof. This results because of the action of the spring 46. The contact 78 also extends radially outward and connects with the stud 16 as described. This provides the hot, or positive, side connection for the device.

The slug 44 may incorporate a fuse 95. Also the plunger 40 may include a fuse 97. Thus plunger 40 could be snap fitted or threaded at one end to sleeve 42.

The plunger 40 connects with the hot side of the vehicle accessory receptacle. Plastic covered brass caps, such as caps 100 and 102, may be provided to cover the studs 14 and 16 respectively and hold leads in position. The caps 100 and 102 may be removed so that an alligator clamp or other connector may be utilized in combination with one or the other of the studs 14 and 16. The ground stud 14 may be utilized to provide a ground for testing circuits. Both the studs 14, 16 may be used to provide a completed power source for testing devices. The light or bulb 54 provides an indication that power is being provided to the various contacts and/or studs. The light bulb 54 is also positioned midway between the studs 14, 16 and has a diameter which is greater than the studs 14, 16. Thus if a wire or rod contacts one stud (e.g. stud 14), it will not form a straight line connection to the other stud 16. In this manner, the possibility of a short circuit is lessened.

It is to be noted, thus, that the contacts 76 and 78 extend generally radially from the axis 29 and provide a duality of function; namely, they provide a connection to the bulb 54 as well as to one of the studs 14 or 16 as the case may be. Also, they act to mechanically retain the bulb 54 in position. The bulb 54 is thus in parallel electrical connection with the studs 14 and 16. The construction is compact, efficient and rugged. Variations of the construction may be effected. For example, the positioning of the studs about the axis 29 may be altered or amended. The particular configuration of the bulb 54 is variable and a bulb or a diode or some other indicator device may be used. Thus the invention is to be limited only by the following claims and equivalents thereof.

What is claimed is:

1. A ground and power source device for use as a testing device in combination with a vehicle accessory receptacle comprising, in combination:

a body having a central through indicator passage for receipt of a light indicator, said indicator passage having a central axis, a first parallel conductive stud passage on one side of the indicator passage, a second parallel conductive stud passage on the opposite side of the indicator passage, said stud and indicator passages each extending through the body;

a cylindrical plug having a cone-shaped end and a flat opposite end, said plug including a plug axis and an axial bore, said bore being of greater diameter at the flat end, said plug further including a first and a second projecting radial flange at the flat end, said flanges projecting in opposite directions from the axis, a flange opening in each flange for receipt of a conductive stud, the flat end positioned in opposition to the body with the flange openings aligned respectively with the stud passages;

a conductive stud in each body stud passage and extending through the associated flange opening, one stud comprising a ground stud and the other stud comprising a hot stud;

a light indicator in the indicator passage having an indicator ground connection and a hot contact connection;

a ground contact intermediate one flange and the body, said contact retained on and in electrical contact with the ground stud, said ground contact projecting radially toward the central axis for contact with the ground connection of the indicator in the indicator passage and simultaneously in electrical contact with the ground stud;

a combination retainer and ground connection also attached to the ground stud and extending axially in the direction of the plug axis along the plug in the form of a flexible bow for ground conduction and simultaneous retention ot the plug in a socket;

a hot contact having first and second ends, said hot contact intermediate the other flange and the body and extending radially to the central axis for engaging the hot contact connection of the light indicator at one hot contact end and for engaging the hot stud at the opposite hot contact end;

a hot contact assembly within the axial bore of the plug including a plunger projecting axially outward from the cone-shaped end of the plug, a slug within the axial bore for axially engaging the hot contact, and a biasing spring between the plunger and slug for simultaneously biasing the plunger and slug in opposite axial directions whereby current flow to the plunger passes to the indicator light and hot stud in parallel.

2. The device of claim 1 wherein the slug slides within a sleeve which retains the spring.

3. The device of claim 1 wherein the plunger includes a flange which limits axial movement of the plunger in the axial bore.

4. The device of claim 1 wherein the body indicator passage includes a bayonet fitting for a light bulb and further including a light bulb in the indicator passage as an indicator.

5. The device of claim 1 further including a fuse in the hot contact assembly.

6. The device of claim 1 further including a fuse incorporated in the plunger of the hot contact assembly, said plunger being detachable from the hot contact assembly for replacement.

* * * * *

UNITED STATES PATENT AND TRADEMARK OFFICE
CERTIFICATE OF CORRECTION

PATENT NO.    : 6,198,272 B1
DATED         : March 6, 2001
INVENTOR(S)   : Pool et al.

It is certified that error appears in the above-identified patent and that said Letters Patent is hereby corrected as shown below:

<u>Column 5, claim 1,</u>
Line 7, should read -- comprising a ground stud and the other stud comprising
Line 23, should read -- retention of the plug in a socket;

Signed and Sealed this

Twenty-sixth Day of February, 2002

Attest:

JAMES E. ROGAN
Attesting Officer
Director of the United States Patent and Trademark Office